US008051355B2

(12) United States Patent
Taubin et al.

(10) Patent No.: US 8,051,355 B2
(45) Date of Patent: Nov. 1, 2011

(54) MULTILEVEL LOW DENSITY PARITY-CHECK CODED MODULATION

(75) Inventors: Felix Aleksandrovich Taubin, St. Petersburg (RU); Andrey Vladimirovich Belogolovy, Saint Petersburg (RU); Aleksandr V. Kozlov, St. Petersburg (RU)

(73) Assignee: Intel Corporation, Santa Clara, CA (US)

( * ) Notice: Subject to any disclaimer, the term of this patent is extended or adjusted under 35 U.S.C. 154(b) by 965 days.

(21) Appl. No.: 11/794,446

(22) PCT Filed: Dec. 29, 2004

(86) PCT No.: PCT/RU2004/000533
§ 371 (c)(1),
(2), (4) Date: Jan. 11, 2008

(87) PCT Pub. No.: WO2006/075929
PCT Pub. Date: Jul. 20, 2006

(65) Prior Publication Data
US 2008/0320362 A1 Dec. 25, 2008

(51) Int. Cl.
*H03M 13/00* (2006.01)
(52) U.S. Cl. .................. 714/752; 714/755; 714/758
(58) Field of Classification Search .............. 714/752, 714/755, 758
See application file for complete search history.

(56) References Cited

U.S. PATENT DOCUMENTS

| 5,467,132 | A | 11/1995 | Fazel et al. |
| 5,691,992 | A | 11/1997 | Molnar et al. |
| 6,031,874 | A | 2/2000 | Chennakeshu et al. |
| 6,292,917 | B1 | 9/2001 | Sinha et al. |
| 6,665,831 | B1 | 12/2003 | Yoshida et al. |
| 6,694,474 | B2 | 2/2004 | Ramprashad et al. |
| 6,718,502 | B1 | 4/2004 | Kuznetsov et al. |
| 6,854,082 | B1 | 2/2005 | Rhee |
| 7,190,732 | B2 | 3/2007 | Chung et al. |
| 7,856,584 | B2 | 12/2010 | Ovchinnikov et al. |
| 2002/0150167 | A1* | 10/2002 | Demjanenko et al. ........ 375/259 |
| 2003/0037298 | A1 | 2/2003 | Eleftheriou et al. |

(Continued)

FOREIGN PATENT DOCUMENTS

JP 2003115768 4/2003

(Continued)

OTHER PUBLICATIONS

Djurdjevic, I., "A Class of Low-Density Parity-Check Codes Constructed Based on Reed-Solomon Codes With Two Information Symbols", *IEEE Communications Letters*, 7(7), (Jul. 2003),317-319.

(Continued)

*Primary Examiner* — Sam Rizk
(74) *Attorney, Agent, or Firm* — Schwegman, Lundberg & Woessner, P.A.

(57) ABSTRACT

A method and apparatus are provided for encoding and decoding a communication signal. Processes for encoding and decoding the communication signal use a first low density parity-check code (LDPC) construction and a second low density parity-check code construction that differs from the first low density parity-check code construction. Multilevel coding (MLC) is applied to protect each address bit of a signal point by an individual LDPC code. In one embodiment, the first level is coded with a progressive edge-growth LDPC code, the second level is coded with a Reed-Solomon LDPC code and the third level is left uncoded.

35 Claims, 5 Drawing Sheets

U.S. PATENT DOCUMENTS

| | | | |
|---|---|---|---|
| 2004/0090943 A1 | 5/2004 | da Costa et al. | |
| 2007/0162818 A1* | 7/2007 | Shen et al. | 714/755 |
| 2007/0271496 A1 | 11/2007 | Krouk et al. | |
| 2008/0086670 A1 | 4/2008 | Krouk et al. | |
| 2008/0086672 A1 | 4/2008 | Ovchinnikov et al. | |

FOREIGN PATENT DOCUMENTS

| | | |
|---|---|---|
| JP | 2004503979 | 2/2004 |
| WO | WO-0197387 A1 | 12/2001 |
| WO | WO-2006073322 A1 | 7/2006 |
| WO | WO-2006073324 A1 | 7/2006 |
| WO | WO-2006075929 A1 | 7/2006 |
| WO | WO-2006130033 A1 | 12/2006 |

OTHER PUBLICATIONS

Eleftheriou, E., et al., "Low-Density Parity-Check Codes for Digital Subscriber Lines", *Proc., IEEE Intl. Conf. on communications*, 1(5), (Apr. 28, 2002),1752-1757.

Hou, J., et al., "Multilevel Coding with Low-Density Parity-Check Component Codes", *Proc., IEEE Global Telecommunications conf., Globecom 2001*, 2 (6), (Nov. 25, 2001),1016-1020.

Hu, X., et al., "Progressive Edge-growth Tanner Graphs", *IEEE global telecommunications conference, Globecom 2001*, 2(6), (Nov. 25, 2001),995-1001.

Hu, Xiao-Yu, et al., "Regular and irregular progressive edge-growth Tanner graphs", *Submitted to IEEE Transactions on Information Theory*, (2003),1-64.

Imai, H., et al., "A New Multilevel Coding Method Using Error-Correcting Codes", *IEEE Transactions on Information theory*, vol. IT-23 (3), (1977),371-377.

Isaka, M., et al., "On the Iterative Decoding of Multilevel Codes", *IEEE Journal on selected areas in communication*, 19 (5), (May 2001),935-943.

MacGregor, D. J., "Good Error-Correcting Codes Based on Very Sparse Matrices", *IEEE Transactions on Information theory*, 45 (2), (Mar. 1999),399-431.

Narayanaswami, R., "Coded Modulation with Low Density Parity Check Codes", *Master thesis.*, (Jun. 2001),1-77.

Rao, S., "The 4D-PAM8 proposal for 10GBASE-T", *P802.3 Task Force Meeting*, URL:http://www.ieee802.org/3/IOGBT/public/nov03/rao_1_1103.pdf>,(Sep. 14, 2005),1-21.

Robertson, P., et al., "An Overview of Bandwidth Efficient Turbo Coding Schemes", *Intl. Turbo COding Schemes*, (Sep. 3, 1997),103-110.

Sridhara, D., et al., "Bandwidth Efficient Modulation Based on Algebraic Low Density Parity Check Codes", *Proc., IEEE Intl. symposium information theory, ISIT2001*, (Jun. 24, 2001),165.

Yu, Y., et al., "Design of Semi-Algebraic Low-Density Parity-Check (SA-LDPC) Codes for Multilevel Coded Modulation", *Proc. Fourth international conference on Parallel and distributed computing, Applications and technologies, pdcat'2003*, (Aug. 27, 2003),931-934.

Gilbert, E N., "A problem in binary coding", *In Proceedings of the Symposium in Applied Mathematics*, vol. 10, (1960),291-97.

Kousa, M. A., et al., "Multichannel Adaptive System", *IEEE Proceedings I. Solid-State & Electron Devices*, Institution of Electrical Engineers, 140(5) Part-I, (Oct. 1, 1993),357-364.

Krouk, E A., et al., "Low-density parity-check burst error-correcting codes", *In 2nd International Workshop Algebraic and combinatorial coding theory*, Leningrad, 1990., (1990),121-124.

Kumar, V., et al., "On Unequal Errol TProtection LDPC Codes Based on Plotkin-type Constructions", *Globecom 2004, Global Telecommunications Conference, IEEE Communications Society*, (Nov. 29, 2004),493-497.

* cited by examiner

US 8,051,355 B2

MULTILEVEL LOW DENSITY PARITY-CHECK CODED MODULATION

RELATED APPLICATIONS

This application is a U.S. National Stage Filing under 35 U.S.C. 371 from International Patent Application Serial No. PCT/RU2004/000533, filed Dec. 29, 2004, and published on Jul. 20, 2006 as WO 2006/075929 A1, which is incorporated herein by reference.

TECHNICAL FIELD

Embodiments of the invention relate generally to communication signals.

BACKGROUND

A communication channel, whether it is a fiber optic channel, a co-axial channel, a wire channel, a wireless channel, or a bus connecting locations in a system over which large amounts of data are transferred, can add noise and errors to information being transmitted over the channel. To correct for errors added by the communication channel, information can be sent in the form of codewords. In order to improve the performance of digital transmission schemes, coded modulation may be used to jointly optimize coding and modulation.

A variety of schemes for encoding and decoding a codeword for propagation through a communication channel exist. Some schemes may provide accuracy, and other schemes may provide fast decoding. In high speed data communication what is needed is a coded modulation scheme that provides for fast decoding procedures and effective error performance, but at the same time can be implemented without a significant amount of complexity.

DETAILED DESCRIPTION

Figure 1:
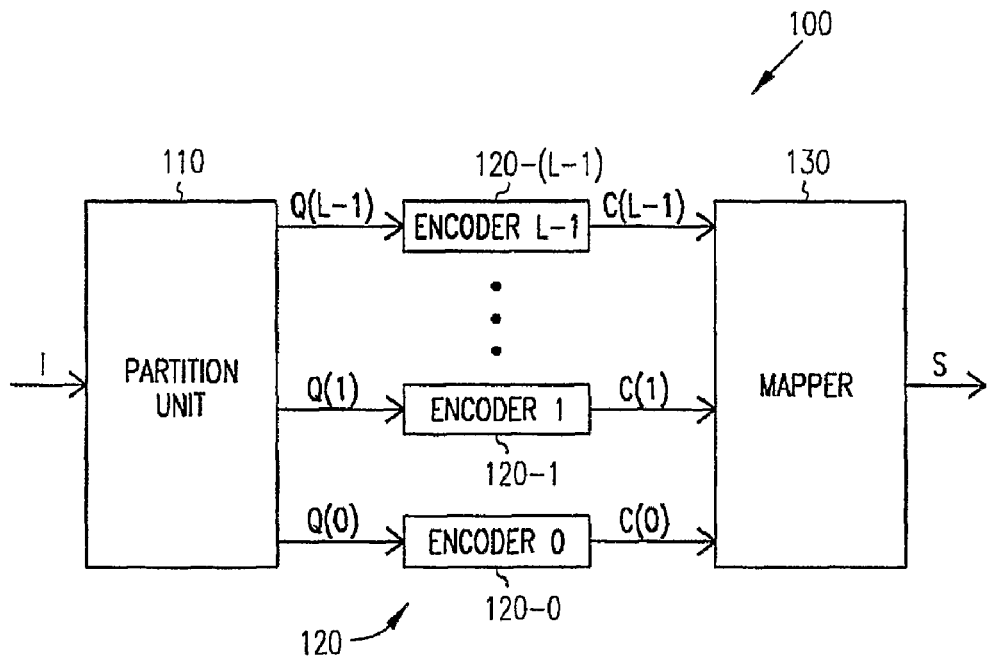
FIG. 1 shows a block diagram of an embodiment of an apparatus that includes an encoder having a first low density parity-check code construction and a second low density parity-check code construction to encode information, where the first low density parity-check code construction differs from the a second low density parity-check code construction.

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized and structural, logical, and electrical changes may be made without departing from the scope of the invention. The various embodiments disclosed herein are not necessarily mutually exclusive, as some disclosed embodiments can be combined with one or more other disclosed embodiments to form new embodiments. The following detailed description is, therefore, not to be taken in a limiting sense, and the scope of the embodiments of the present invention is defined only by the appended claims, along with the full scope of equivalents to which such claims are entitled.

In various embodiments, multilevel coded modulation schemes include two or more low-density parity-check (LDPC) code constructions to encode and decode data. The application of LDPC code constructions provide for fast decoding procedures and effective error performance. Embodiments for multilevel LDPC coded modulation may be implemented in 10 Gigabit (10 G) Ethernet networks, providing error correction for such 10 Gigabit Ethernet networks.

To correct for errors added by the communication channel, information can be sent in the form of codewords, where each codeword contains a number of bits as information (message) bits and a number of bits for error correction. A codeword having a length of n bits includes k bits for the message length of the code and r=n−k redundant bits. The r bits are for correction and may be r parity check bits. A parity check matrix, H, contains a set of parity check equations that define the codeword according to the relation:

$$HC^T = 0,$$

where C is the n-dimensional vector of the codeword bits. At a receiver, if this relation is not satisfied, then the received codeword is not valid and must either be corrected or retransmitted.

Low-density parity-check codes provide a powerful forward error correcting tool in high-speed communication systems due to the low decoding complexity and the bit-error rate (BER) achieved in an additive white Gaussian noise (AWGN) channel. LDPC codes may use a parity check matrix containing mostly zeros and a limited number of ones. A binary (n, γ, ρ) LDPC code has a codeword length, or block length, of n bits and a parity check matrix with exactly γ ones in each column and exactly ρ ones in each row. In the LDPC code, each code bit is checked by γ parity checks and each parity check uses ρ code bits. Further, the code has a rate, R, defined as R=k/n, where k is the number of message (information) bits in the codeword having n bits. As is understood by those skilled in the art, there are a number of LDPC code constructions that may be used in transmitting information, such as a progressive edge-growth LDPC code construction, a Reed Solomon LDPC code construction, LDPC code constructions based on Euclidian geometries, LDPC code constructions based on Vandermonde matrix and cyclic permutation blocks, and various other constructions.

A selected code construction may be combined with a signaling format to provide coded modulation. For example, an LDPC codeword may be transmitted by mapping the bits of the codeword to a set of symbols generated by the signaling format such as a pulse amplitude modulation (PAM) signaling format. The set of symbols is an alphabet for the signaling format. For instance, a PAM-N format may have N levels where each level represents a symbol of an alphabet for the PAM-N format. A PAM-5 format may include an alphabet having symbols {+2, +1, 0, −1, −2}, while a PAM-8 format may include an alphabet having symbols {+7, +5, +3, +1, 0, −1, −3, −5, −7}. Such a channel alphabet is not binary.

FIG. 1 shows a block diagram of an embodiment of an apparatus 100 that includes an encoder 120 having a first low density parity-check code construction and a second low density parity-check code construction to encode information, where the first low density parity-check code construction differs from the a second low density parity-check code construction. Apparatus 100 includes a partition unit 110 to partition information I into a plurality of sub-blocks Q(0), Q(1), . . . Q(L−1) and a mapper 130. Information I may be provided to partition unit 110 as a data block.

Encoder 120 encodes each sub-block Q(0), Q(1), . . . Q(L−1) of message bits into codewords C(0), C(1), . . . C(L−1), where encoder 120 includes two or more LDPC code constructions that differ from each other to encode these sub-blocks. The number of bits in each codeword C(0), C(1), . . . C(L−1) depends on the application. In an embodiment, encoder 120 includes a number of LDPC code constructions equal to the number of sub-blocks L. In an embodiment, encoder 120 includes a number of LDPC code constructions equal to one less than the number of sub-blocks such that a sub-block of bits are uncoded. In an embodiment, encoder 120 includes two LDPC code constructions, one LDPC code construction to encode a group of bits at one level and the second LDPC code construction to encode another group of bits at a second level. Encoder 120 may be realized as a set of encoders 120-0, 120-1, . . . 120-(L−1). Encoder L−1 may be configured to generate a codeword from a set of message bits in which the message bits are uncoded, that is, the codeword includes only the message bits.

Mapper 130 maps codewords C(0), C(1), . . . C(L−1) into a signal S for propagation onto a medium from a transmitter. In an embodiment, mapper 130 is configured to provide bit-to-symbol mapping of the L codewords. In an embodiment, mapper 130 is configured to map L−1 codewords with uncoded bits.

Figure 2:
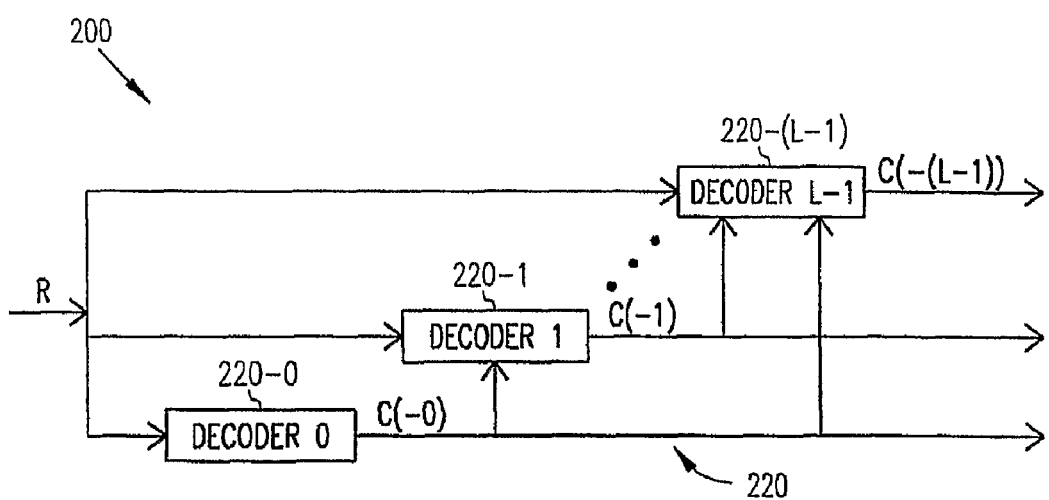
FIG. 2 shows a block diagram of an embodiment of an apparatus that includes a decoder having a first low density parity-check code construction and a second low density parity-check code construction to decode a signal, where the first low density parity-check code construction differs from the a second low density parity-check code construction.

FIG. 2 shows a block diagram of an embodiment of an apparatus 200 that includes a decoder 220 having a first low density parity-check code construction and a second low density parity-check code construction that differs from the first low density parity-check code construction to decode a received signal R. Decoder 220 may be configured to decode a multilevel code using a number of different LDPC code constructions. In an embodiment, decoder 220 maybe be adaptively configured to decode a multilevel code that has been encoded in an embodiment associated with encoder 120 of FIG. 1 to provide representation codewords C(−0), C(−1), . . . C(−(L−1)) corresponding to codewords C(0), C(1), . . . C(L−1) generated by encoder 120. Representation codewords C(−0), C(−1), . . . C(−(L−1)) may be further processed in apparatus 200 to provide information I of FIG. 1.

Decoder 220 may be realized as a single decoder having multiple LDPC code constructions to decode received signal R to recover transmitted information. Decoder 220 may be realized as L decoders 220-0, 220-1, . . . 220-L−1, each decoder having its own LDPC code construction. In an embodiment, decoder 220 has two LDPC code constructions. In an embodiment, decoder 220 is adapted to decode a received signal using an LDPC code construction to generate a first level codeword and to decode the received signal using another LDPC code construction and the first level codeword to generate a second level codeword. The codeword, at each level, may correspond to a codeword generated by an encoder, at a corresponding level, from a transmitting node initiating the signal propagation providing received R at apparatus 200. Decoder 220 may be realized as a combination of a demodulator and decoder.

Figure 3:
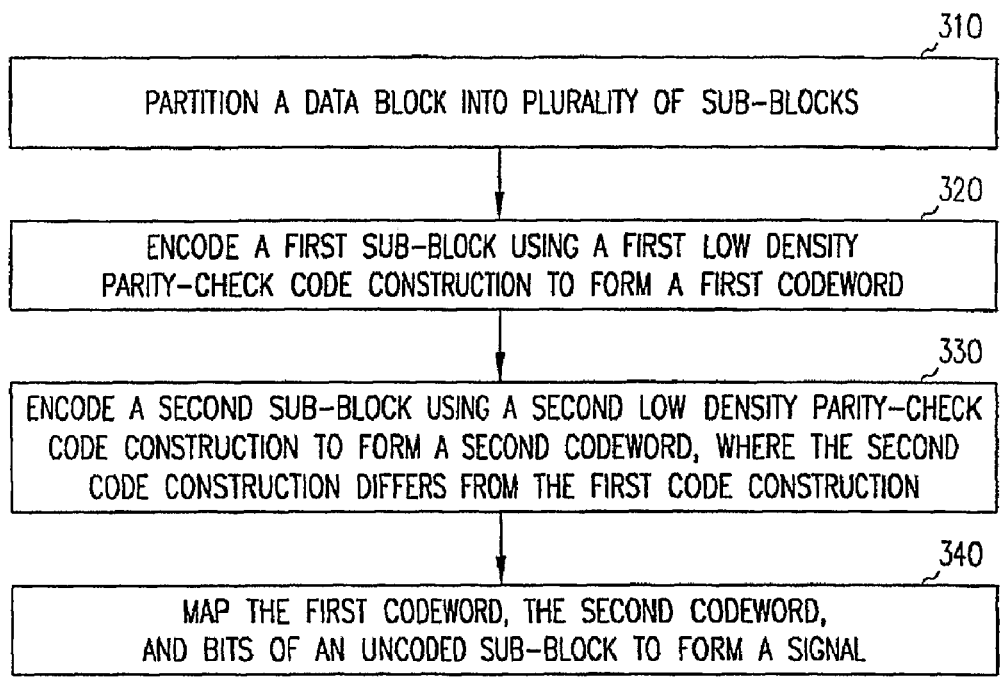
FIG. 3 shows a flow diagram of an embodiment of a method to encode data using two low density parity-check code constructions.

FIG. 3 shows a flow diagram of an embodiment of a method to encode data using a first low density parity-check code construction and a second low density parity-check code construction. At 310, a data block is partitioned into a plurality of sub-blocks. At 320, a first sub-block is encoded using a first LDPC code construction to form a first codeword. At 330, a second sub-block is encoded using a second LDPC construction to form a second codeword, where the second LDPC code construction differs from the first LDPC code construction. At, 340, the first codeword, the second codeword, and bits of an uncoded sub-block are mapped to form a signal.

Coded modulation may provide for jointly optimizing coding and modulation to improve the performance of digital transmission schemes. Embodiments for a multilevel coding scheme may be related to a coding scheme using coset codes, where each point in a constellation is selected by an index, where some bits of the index are encoded with an error-correcting code. Multilevel coding (MLC) is applied to protect each address bit $x_i$ of a signal point by an individual binary codeword $C_i$ at level i. In MLC, a data block q is partitioned into a number of sub-blocks. Each sub-block is encoded with its specific $(N, K_i)$ codeword $C_i$. Conventional techniques for multilevel coding are known to those skilled in the art.

In an embodiment, a multilevel coded modulation scheme includes using an LDPC code at a first level and another LDPC code at a second level with a third level uncoded. In an embodiment, N message bits are partitioned into L number of sets depending on the number of coded modulation levels, each set having a number, $M_i$, of message bits, where $N = \Sigma M_i$. An alphabet for a signaling format may be arranged as a number of levels. At a first level, the alphabet is partitioned into a number of cosets, where a coset is a subset of the set of symbols of the alphabet. A second level may be generated by partitioning each coset into a number of co-cosets. Further levels may be generated by further partitioning co-cosets into subsets, and then these subsets into other subsets until the desired number of levels is formed. The number of levels may be L−1, corresponding to one less than the number of sets into which the message bits are partitioned. Within each level, a symbol belongs to only one subset. A number of LDPC code constructions, in which there are at least two differing code constructions, may be implemented to select a coset, a co-coset, and other subsets of the alphabet. The total number of LDPC code constructions used may be set at L−1.

One set of bits having the largest number of bits, $M_k$, may be uncoded and may be considered to be an $(M_k, M_k)$ codeword. Each of the remaining sets of message bits is encoded using its associated LDPC code construction to form a codeword $(M_k, M_i)$ at a given level, where $M_i$ is the number of message bits and $M_k$ is the codeword length. Each ith bit of the codeword at the first level selects, or maps to, a coset at the first level. Then, based on the mapping at the first level, each ith bit of the second level codeword selects, or maps to, a co-coset at the second level, and so on. After the L−1 mappings, each ith bit of the uncoded codeword selects a symbol of the alphabet from the last level mapping. A modulated code is then transmitted as a block of $M_k$ alphabet symbols, that is, the output channel alphabet block has the same length as the codeword length at each level.

Though each symbol may not be binary, the generation of the coset levels for the levels is based on a binary process. Each ith bit of the codeword is either a "0" or a "1." When an ith bit selects a coset, co-coset, or any subsequent subset, the mapping, or selection process, is a selection of one set of two possible sets. Thus, the application of the previous codeword at the previous level reduces the selection process to a binary one. As the process progresses to the L level, the ith bit of the uncoded codeword selects a symbol.

In an illustrative example of an embodiment, 8-level PAM signaling may be used with two LDPC code constructions. An exemplary alphabet for the PAM-8 format may include signal set, A={+7, +5, +3, +1, −1, −3, −5, −7}. A example message, such as ( . . . , 1, . . . , . . . , 0, 1, . . . , . . . , 0, 1, 0, . . . ), may be divided into 3 parts ( . . . , 1, . . . ), ( . . . , 0, 1, . . . ), and ( . . . , 0, 1, 0, . . . ). The example message has N message bits, part 1 has message length $M_1$, part 2 has message length $M_2$, and part 3 has message length $M_3$, where $N=M_1+M_2+M_3$. Part 1 is LDPC-1 encoded to ($M_3$, $M_1$) codeword-1, part 2 is LDPC-2 encoded to ($M_3$, $M_2$) codeword-2, and part 3 is uncoded as ($M_3$, $M_3$) codeword-3. At the first level, cosets $A_0$ and $A_1$ of A may be formed as $A_0$={−7, −3, 1, 5,} and $A_1$={−5, −1, 3, 7}. The 0 subscript indicates that a 0 in the codeword will select $A_0$ coset and a 1 subscript indicates that a 1 in the codeword will select $A_1$ coset. At the second level, co-cosets may be formed, for example, from $A_0$ and $A_1$ as $A_{00}$={−7, 1}, $A_{01}$={−3, 5} and $A_{10}$={−5, 3}, $A_{11}$={−1, 7}, where $A_{ij}$ is selected by bit "i" in the codeword-2 and bit "j" in codeword-1.

The LDPC-1 encoded ($M_3$, $M_1$) codeword-1 maps to a set of cosets at level 1. Each bit of codeword-1 maps to a coset at level one. For example a codeword-1 formed as ( . . . , 1, 1, 0 . . . ) maps to { . . . , $A_1$, $A_1$, $A_0$, . . . }={ . . . , {−5, −1, 3, 7}, {−5, −1, 3, 7}, {−7, −3, 1, 5), . . . }. Then, the LDPC-2 encoded ($M_3$, $M_2$) codeword-2, for example ( . . . , 0, 1, 1, . . . ), splits the already selected cosets further: cosets { . . . , $A_1$, $A_1$, $A_0$, . . . } and codeword-2=( . . . , 0, 1, 1, . . . ) map to co-cosets { . . . , $A_{10}$, $A_{11}$, $A_{01}$, . . . }={ . . . , {−5, 3}, {−1, 7}, {−3, 5}, . . . }. The uncoded bits of codeword-3 select the final signals inside the previously selected cosets. In an embodiment, a "0" in the uncoded bits always selects a left signal inside the two symbol co-coset, and a "1" in the uncoded bits selects a right signal inside the two symbol co-coset. In such a case, previously selected co-cosets { . . . , $A_{10}$, $A_{11}$, $A_{01}$, . . . }={ . . . , {−5,3}, {−1, 7}, {−3, 5}, . . . } and uncoded bits for example ( . . . , 0, 1, 0, . . . ) map to the set of symbols { . . . , −5, 7, −3, . . . }. The output of the encoding is { . . . , −5, 7, −3, . . . }. The { . . . , −5, 7, −3, . . . } block of symbols may be transmitted as a signal such as S in FIG. 1. In an embodiment, a progressive edge-growth LDPC code construction, PEG(2048, 1018), having a code length of 2048 and a message length of 1018 is applied at the first level and a Reed Solomon LDPC code construction, RSLDPC(2048, 1921), having a code length of 2048 and a message length of 1921 is applied at the second level. In an embodiment, a PAM constellation is partitioned into two 4-level cosets with PEG (2048, 1018) code used for coset selection. Each 4-level coset is partitioned into two 2-level co-cosets with an RSLDPC (2048, 1921) code used for co-coset selection. Each uncoded bit selects a particular signal in a co-coset, and consequently the particular signal in a coset. In an embodiment, a MLC encoding process is performed using multiple low density parity-check code constructions, where there are at least two LDPC code constructions that differ.

Embodiments of multilevel LDPC coded modulation provide for parameter optimization in networks such as 10 Gigabit Ethernet networks. To provide enhanced performance, the component codes for embodiments of a multilevel scheme are selected to match the coded modulation level properties. For instance, properties at the first level include having the largest noise at the input of a decoder, while the second level provides a significantly lower noise level. Then, the code on the first level of coded modulation may be selected to operate in such a harsh channel to provide better performance at low signal to noise ratios, though by itself the LPDC code construction may have an error floor. The code on the second level of coded modulation may be selected to provide absence of an error floor. An error floor effect is an effect related to a non-decreasing bit-error rate with increasing signal-to-noise ratio. The bit-error rate curve is an important factor when considering the quality of decoding a coded demodulation scheme. A bit-error rate degradation speed that is very high (usually called a "waterfall") is typically a good characteristic. When the bit-error rate degradation speed is high in the beginning of the curve and then changes to a lower speed, i.e., there is a change in the slope of the BER curve, a change in the degradation speed, which is called as "error-floor." For example, curve 610, scheme RSLDPC(2048,1723), of FIG. 6 has an error-floor.

A primary goal of coded modulation is to provide enhanced performance, such as a low required SNR, and an absence of an error floor. However, it is difficult to find a single code for coded modulation that provides both of these properties. In the case of 3-level coded modulation, there are 2 coded levels and 1 uncoded level. On the first coded level, the code may be selected to provide a best bit-error rate degradation speed for low SNRs, where an error floor may be acceptable. On the second level, the code operates with high SNRs and is constructed to avoid an error floor. To provide absence of error floor, the code should meet a sufficient minimum distance (a distance is measure of a difference between codewords) and may have a high code rate, such as about 0.98. The use of multiple LDPC codes together may substantially provide an absence of error floor. In this situation, LDPC codes have small parity-check matrices and the LDPC decoding is not complex, even if the code has a higher minimum distance. A high minimum distance may be provided if the parity-check matrix of a LDPC code has a large number of "ones" in its matrix columns. However, at a receive end, the complexity of decoding LDPS codes is also affected by the number of "ones" in the parity-check matrix.

Figure 4:
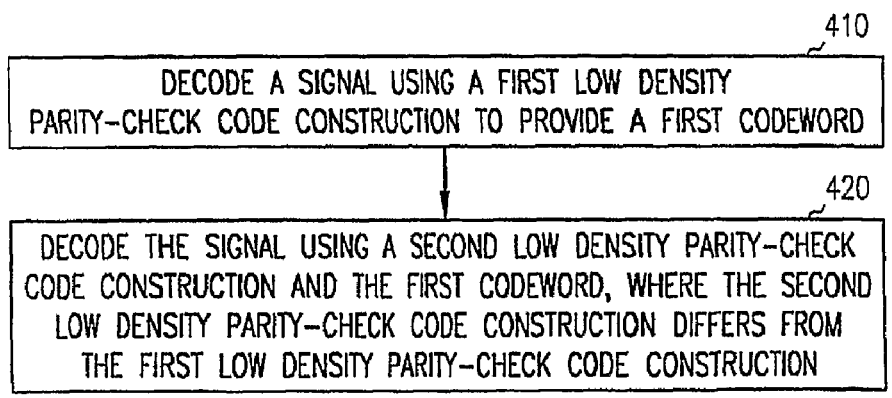
FIG. 4 shows a flow diagram of an embodiment of a method to decode data using two constructions low density parity-check code construction.

FIG. 4 shows a flow diagram of a method to decode data using a first low density parity-check code construction and a second low density parity-check code construction. At 410, a signal is decoded using the first LDPC code construction to generate a first codeword. At 420, the signal is decoded using the second LDPC code construction and the first codeword to generate a second codeword. Higher level codewords may be derived using associated LDPC code constructions and the generated lower level codewords.

A method of decoding multilevel codewords may include decoding each codeword individually starting from a lowest level and taking into account decisions of prior decoding stages. Such procedure is called multistage decoding (MSD). In an embodiment, decoding includes multistage decoding with multiple low density parity-check constructions used to decode the codewords, where there are at least two LDPC code constructions that differ.

In an embodiment, a demodulation process using multiple LDPC code constructions begins with reception of a block of symbols. At a first level of the coded modulation, reliabilities associated with the first level cosets from the encoding process are calculated. A demodulator may determine from the received signal what cosets were used, may make reliabilities for decoding, and may start decoding the received signal of symbols. For a given received symbol, the demodulator determines which symbol is closet to the received value, which also selects the appropriate first level coset. With all received bits mapped to appropriate first level cosets, a codeword is formed and provided to a first level decoder. The decoder may correct errors in the codeword. At this level, a first part of the message having $M_1$ bits is determined and correct first level cosets are found.

The process is continued at the second level. The received sequence of symbols is compared with the level two co-cosets, taking into account the cosets of the first level, i.e., a given received symbol is compared with the symbols inside the co-cosets corresponding to the first level coset already selected. With the received signals for the symbols perturbed from the values of the symbols, the closest co-cosets will be selected and a level two codeword formed. The level two codeword is provided to a level two decoder and, if no errors are found, the formed level two codeword will be accepted as correct. The level two decoder may correct the level two codeword. At this stage of the process, a second message part having $M_2$ bits is determined along with the co-cosets at the second level. The process may continue as previously conducted taking into account previous level demodulating and decoding dependent upon the number of levels to provide other message parts having $M_i$ bits.

At a last level, corresponding to the code modulation at a transmitting end using uncoded bits, the uncoded bits are extracted. The signals inside the received symbol sequence are each tested to determine if they are closer to one of two symbols inside the already selected symbol subset. The closest match is selected for each signal in the sequence and a codeword of uncoded bits is formed to provide the uncoded $M_k$ message bits. Then, the L number of message parts, corresponding to the partitioning of the complete message at the transmitting end, are combined to provide the whole message of $N=\Sigma M_i$ bits.

In an illustrative example of an embodiment, demodulating and decoding of a received sequence of symbols may be performed for a message encoded and modulated with 8-level PAM signaling with two LDPC code constructions as discussed above with respect to encoding. The above exemplary alphabet for the PAM-8 format includes signal set, $A=\{+7, +5, +3, +1, -1, -3, -5, -7\}$. An example of an embodiment for decoding may be illustrated by considering a received signal $R=\{\ldots, -6.99, 7.22, -3.25, \ldots\}$, such as signal R in FIG. 2, received from a transmission of $S=\{\ldots, -5, 7, -3, \ldots\}$ from the above illustrative encoding example for example message, $(\ldots, 1, \ldots, \ldots, 0, 1, \ldots, \ldots, 0, 1, 0, \ldots)$. The LDPC-1 code construction from the encoding process may be used at level one decoding and the LDPC-2 code construction from the encoding process may be used at level two decoding.

For the first level of the coded modulation, the received signal R is demodulated with respect to known cosets, $A_0=\{-7, -3, 1, 5,\}$ and $A_1=\{-5, -1, 3, 7\}$. The received signal point $-6.99$ is closet to point 7, which is in $A_0$. Each received signal is compared to the known alphabet and known coset structure and the closet symbol is selected. The set of closet symbols provides a first level codeword and associated coset sequence. The received sequence $\{\ldots, -6.99, 7.22, -3.25, \ldots\}$ may be mapped to codeword $(\ldots, 0, 1, 0, \ldots)$ and associated coset sequence $\{\ldots, A_0, A_1, A_0, \ldots\}$ with the demodulated codeword provided to the first level decoder. This codeword contains 1 error, but it will be corrected by the first level decoder, and the output of the decoder will be $(\ldots, 1, 1, 0, \ldots)$. At this point, message part 1, $(\ldots, 1, \ldots)$, having $M_1$ bits of the transmitted message is extracted from the codeword and the correct cosets sequence $\{\ldots, A_1, A_1, A_0, \ldots\}$ used to encode are known.

In the same manner, the demodulating and decoding continues at the second level. The sequence $\{\ldots, -6.99, 7.22, -3.25, \ldots\}$ is compared with the level two co-cosets, given that the results from the first level one demodulation. The signal $-6.99$ will be compared with the signals inside the cosets $A_{11}$ and $A_{10}$, because $A_1$ was already selected. The signal $7.22$ will also be compared with the signals inside the cosets $A_{11}$ and $A_{10}$, because $A_1$ was already selected. The signal $-3.25$ will be compared with the signals inside the cosets $A_{01}$ and $A_{00}$, because $A_0$ was selected by the level one demodulation. The closest coset sequence is $\{\ldots, A_{10}, A_{11}, A_{01}, \ldots\}$, and the level two codeword is formed as $(\ldots, 0, 1, 1, \ldots)$. The level two codeword is passed to the second level decoder. If there are no errors, the second level decoder will return the same codeword. Otherwise, the second level decoder may return a corrected codeword. At this point in decoding, message part 2, $(\ldots, 0, 1, \ldots)$, having $M_2$ of the original message is extracted and the second level co-coset sequence $\{\ldots A_{10}, A_{11}, A_{01}, \ldots\}$ used to encode is known.

The uncoded bits of the transmitted message are extracted next. The signals inside the received sequence $\{\ldots, \mathbf{-6.99}, \mathbf{7.22}, \mathbf{-3.25}, \ldots\}$ are tested to determine whether they are closer to the left signals inside already selected co-cosets or whether they are they closer to the right signal (left and right as identified during modulation). Co-coset sequence $\{\ldots, A_{10}, A_{11}, A_{01}, \ldots\} = \{\ldots, \{-5, 3\}, \{-1, 7\}, \{-3, 5\}, \ldots\}$, so $-6.99$ is closer to the left part of $A_{10}$, $7.22$ is closer to the right of $A_{11}$, $-3.25$ is closer to the left of $A_{10}$ mapping to $(\ldots, 0, 1, 0, \ldots)$ uncoded bits having $M_3$ bits for part 3. Then, the whole message of $N=M_1+M_2+M_3$ bits from the transmitted end may be provided as the combination of message portions from the decoded codewords, which in the example becomes $(\ldots, 1, \ldots) + (\ldots, 0, 1, \ldots) + (\ldots, 0, 1, 0, \ldots) = (\ldots, 1, \ldots, \ldots, 0, 1, \ldots, \ldots, 0, 1, 0, \ldots)$.

Multiple LDPC codes in a multilevel coded modulation scheme provide codes that have soft-input decoding algorithms. Further, LDPC codes show good performance in AWGN channels, better than any other known codes. Additionally, the complexity of decoding LDPC codes is very low.

Figure 5:
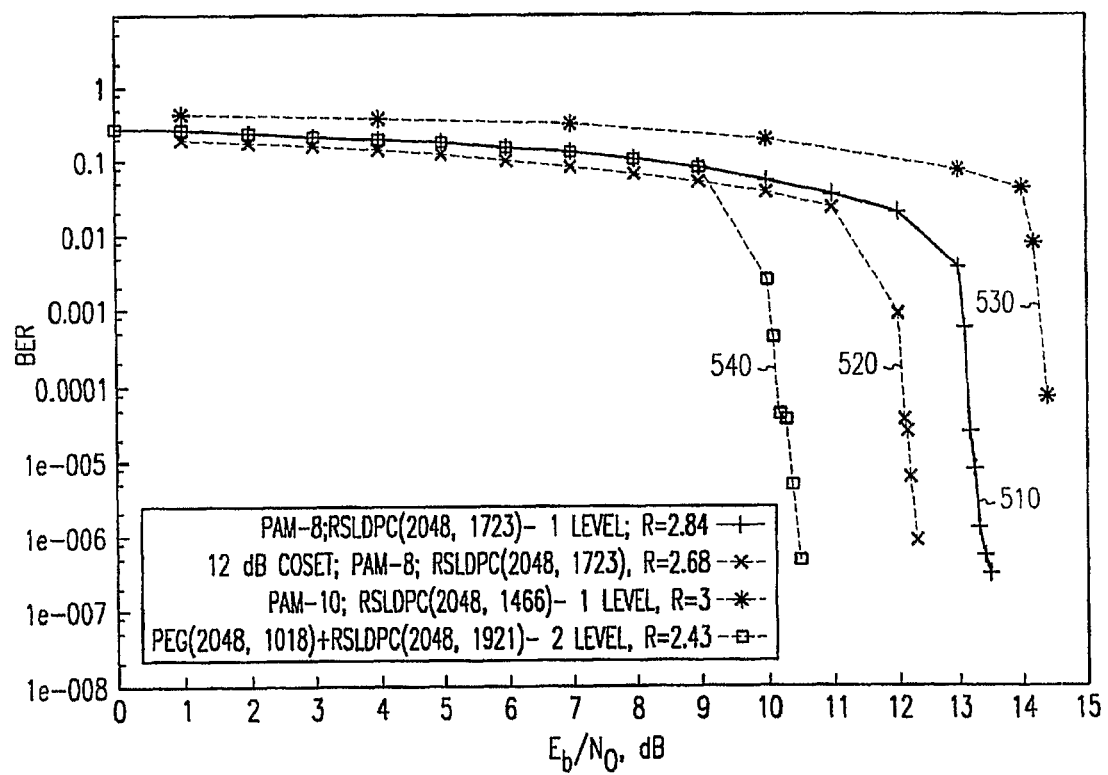
FIG. 5 demonstrates an example of performance of an embodiment using a code scheme having two low density parity-check code constructions with respect to several code constructions for an additive white Gaussian noise channel.

FIG. 5 demonstrates an example of simulated performance of an embodiment using a code scheme using two low density parity-check code constructions 540 with respect to several code constructions 510, 520, and 530 for an additive white Gaussian noise (AWGN) channel. The comparison is illustrated in terms of the bit error rate (BER) as a function $E_b/N_0$ (ratio of bit energy to noise power spectral density). Code schemes 510 and 530 are single level coding schemes and 520 is a 12 dB coset partitioning code scheme. Code scheme 540 demonstrates an embodiment that uses a progressive edge-growth LDPC code construction having a code length of 2048 and a message length of 1018 and a Reed Solomon LDPC code construction having a code length of 2048 and a message length of 1921, where code scheme 540 has a coded modulation rate of $r=2.43$. Code scheme 510 is a Reed Solomon LDPC code construction having a code length of 2048 and a message length of 1723 for an 8-level Pulse Amplitude Modulation (PAM-8) with a coded modulation rate of r=2.84. Code scheme 520 is a Reed Solomon LDPC code construction having a code length of 2048 and a message length of 1723 for a 12 dB coset partitioned PAM-8 with a coded modulation rate of r=2.68. Code scheme 530 is a Reed Solomon LDPC code construction having a code length of 2048 and a message length of 1466 for PAM-10 with a coded modulation rate of r=3. For non-binary channels, the coded modulation rate is measured in bits per sample with the rate limited to the binary logarithm of the channel dimension. For example, an uncoded PAM-8 has a coded modulation rate with an upper limit of 3, and an uncoded PAM-10 has a coded modulation rate with an upper limit of 3.32. FIG. 5 demonstrates that a given BER may be attained at a lower $E_b/N_0$ ratio for an embodiment having two LPDC code constructions.

Figure 6:
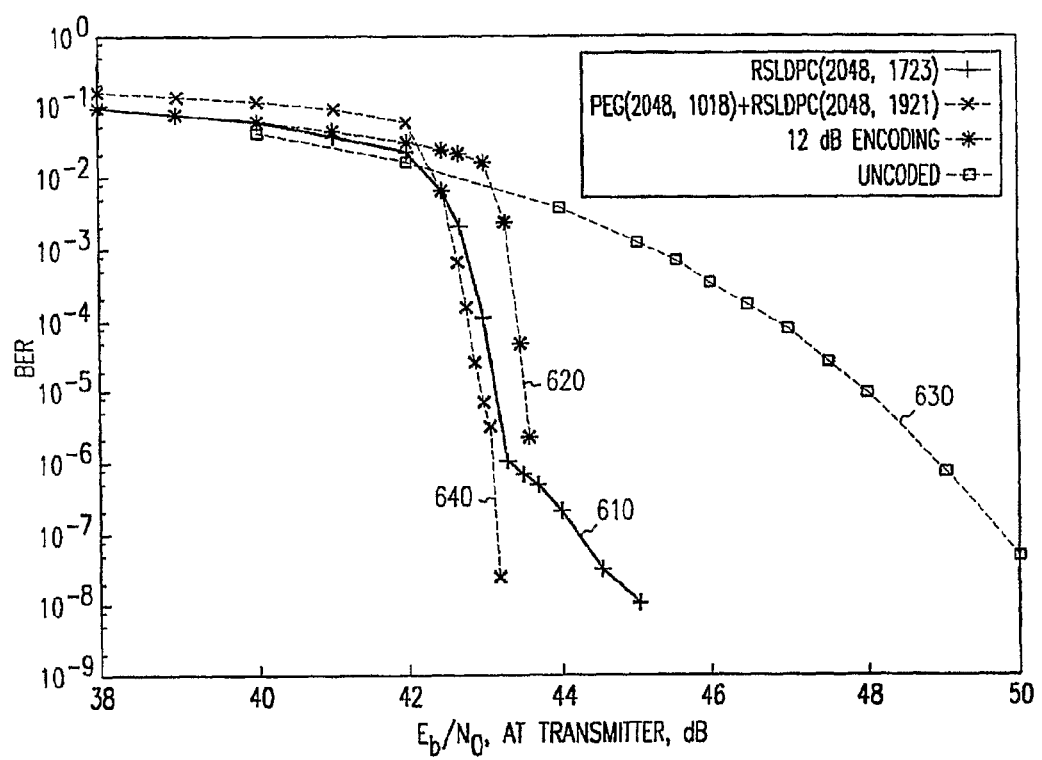
FIG. 6 demonstrates an example of performance of an embodiment using a code scheme having two low density parity-check code constructions with respect to several code constructions for 10 Gigabit transmission based on Tomlinson-Harashima precoding on a category 6 unshielded twisted pair.

FIG. 6 demonstrates an example of simulated performance of an embodiment using a code scheme using two low density parity-check code constructions 640 with respect to several code constructions 610, 620, and 630 for a 10 Gigabit transmission based on Tomlinson-Harashima preceding on a category 6 unshielded twisted pair. The comparison is illustrated in terms of the bit error rate as a function $E_b/N_0$. Code scheme 640 demonstrates an embodiment that uses a progressive edge-growth LDPC code construction having a code length of 2048 and a message length of 1018 and a Reed Solomon LDPC code construction having a code length of 2048 and a message length of 1921. Code scheme 610 is a Reed Solomon LDPC code construction having a code length of 2048 and a message length of 1723. Code scheme 620 is for 12 dB encoding. Code scheme 630 is for an uncoded signal. FIG. 6 demonstrates that a given BER may be attained at a lower $E_b/N_0$ ratio for an embodiment having two LPDC code constructions.

Various embodiments or combination of embodiments for apparatus and methods for decoding and encoding using two low density parity-check code constructions may be realized in hardware implementations, software implementations, and combinations of hardware and software implementations. These implementations may include a computer-readable medium having computer-executable instructions for performing one or more embodiments. The computer-readable medium is not limited to any one type of medium. The computer-readable medium used will depend on the application using an embodiment.

Figure 7:
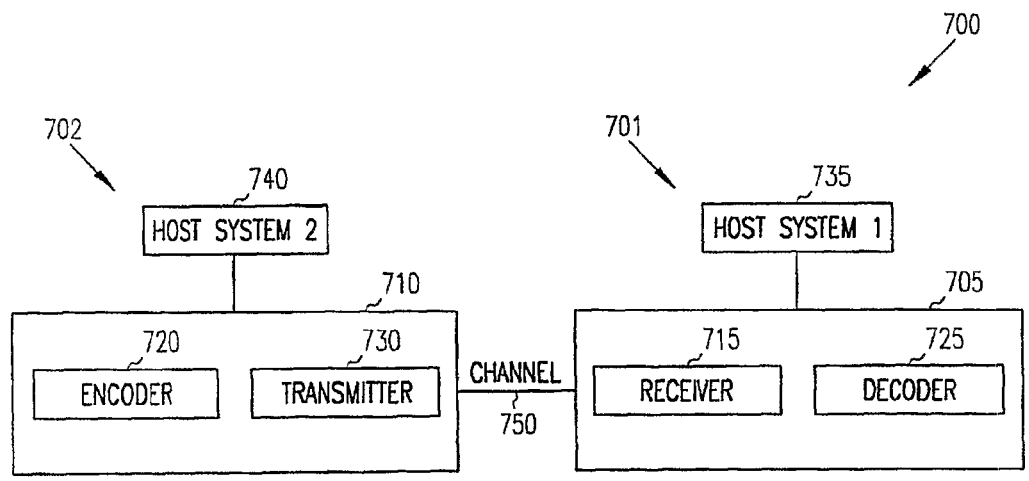
FIG. 7 illustrates a block diagram of an embodiment of a communication network having systems implementing a coding scheme using two low density parity-check code constructions.

FIG. 7 illustrates a block diagram of an embodiment of a communication network 700 having systems implementing a coding scheme having a first and a second low density parity-check code construction. Communication network 700 may include network node 701 including an apparatus 705 with a decoder 725 having the first and second LDPC code constructions and network node 702 including an apparatus 710 with an encoder 720 having the first and second LDPC code constructions. Apparatus 705 and apparatus 710 may be realized as one or more embodiments of an apparatus using one or more embodiments of methods for encoding and decoding.

Network node 701 may include a host system 735 coupled to apparatus 705 that includes a receiver 715 and decoder 725. Apparatus 705 may be configured as a receiver that incorporates receiver 715 and decoder 725. Apparatus 705 may include a transceiver. Apparatus 705 may receive signals carrying data from channel 750. The data may be decoded into appropriate codewords to provide information to host system 735. A host system may provide one or more functions at a node. A host system may direct operations of other systems and/or apparatus at the node. Host system 735 may include an external connection that is wired or wireless, as part of the coupling to apparatus 705. Alternatively, host system 735 may include apparatus 705. In an embodiment, host system 735 may be an external system to apparatus 705. Host system 735 may be realized as a switch, a router, a computer, a server, or combination of these elements. Host system 735 may couple to apparatus 705 over a medium that is compatible with Peripheral Component Interconnect (PCI) or with PCI express.

Network node 702 may include a host system 740 coupled to an apparatus 710 that includes a transmitter 730 and encoder 720. Apparatus 710 may be configured as a transmitter that incorporates transmitter 730 and encoder 720. Apparatus 710 may include a transceiver. Apparatus 710 may generate signals carrying data into channel 750. The data may provide information that originates from host system 740. Host system 740 may include an external connection that is wired or wireless, as part of the coupling to apparatus 710. Alternatively, host system 740 may include apparatus 710. In an embodiment, host system 740 may be an external system to apparatus 710. Host system 740 may be realized as a switch, a router, a computer, a server, or combination of these elements. Host system 740 may couple to apparatus 710 over a medium that is compatible with Peripheral Component Interconnect (PCI) or with PCI express.

The network nodes 701, 702 each may represent processing systems having a physical layer (PHY) entity arranged to operate in accordance with 10GBase-T as defined by the IEEE 802.3 an series of standards, for example. The 10GBase-T PHY may interface with, for example, a 10 G media access control (MAC) and Gigabit Media Independent Interface (XGMII) in the IEEE architecture. The 10GBase-T PHY may include part of a network interface card (NIC), for example. Nodes 701, 702 may include any processing system and/or communications device suitable for use with a 10GBase-T device. For example, nodes 701, 702 may be implemented as a pair of switches, a pair of routers, a pair of servers, a switch and a router, a switch and a server, a server and a router, and so forth. In addition, nodes 701, 702 also may be part of a modular system in which 10GBase-T is the high-speed connection for the system. In an embodiment, network nodes 701, 702 may be arranged such that host system 735 and host system 740 are configured as a single host system. Further examples for nodes 701, 702 may include high-end servers, supercomputers, clusters, grid computing, workgroup switch uplinks, aggregation uplinks, storage systems, and so forth. The embodiments are not limited in this context.

Figure 8:
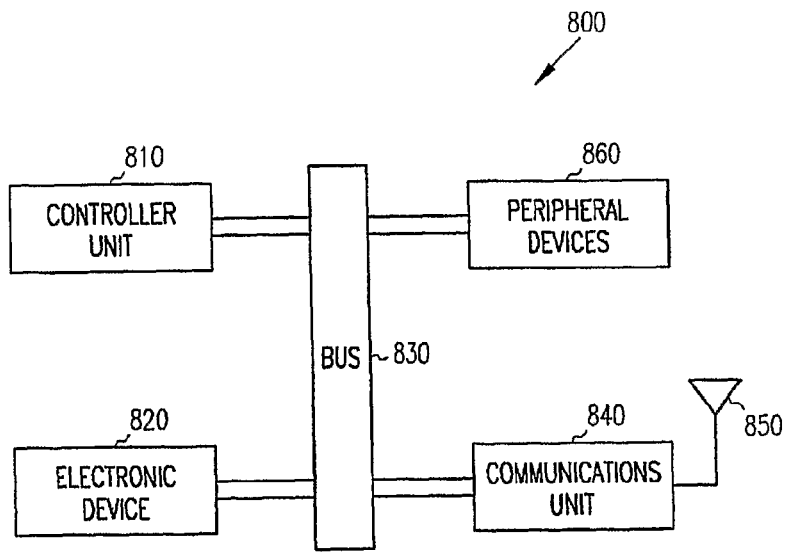
FIG. 8 illustrates a block diagram of an embodiment of a system having a data coding scheme using two low density parity-check code constructions.

FIG. 8 illustrates a block diagram of an embodiment of a system 800 having a data coding scheme using two low density parity-check code constructions. System 800 includes a controller 810, an electronic device 820, and a bus 830, where bus 830 provides electrical connectivity between controller 810 and electronic device 820, and between controller 810 and a communication unit 840. Communication unit 840 may be a network interface to couple to a wired network or a network interface to couple to a wireless network. Alternatively, communication unit 840 may be a network interface to couple to a wired network and to a wireless network. A wired network may include a network having wire channels, fiber optic channels, and/or co-axial channels.

An embodiment may include an additional peripheral device or devices 860 coupled to bus 830. Bus 830 may be compatible with PCI or with PCI express. In an embodiment, communication unit 840 may include a network interface card. In an embodiment, communication unit 840 may include a communications device suitable for use with a 10GBase-T device. In a wireless embodiment, communication unit 840 is coupled to an antenna 850. In an embodiment, antenna 850 may be a substantially omnidirectional antenna. Electronic system 800 may include, but is not limited to, information handling devices, wireless systems, telecommunication systems, fiber optic systems, electro-optic systems, and computers.

In an embodiment, controller 810 is a processor. In an embodiment, electronic device 820 is a transceiver that allows system 800 to communicate with other systems. Transceiver 820 may include encoding and decoding units in various appropriately modified combinations of the embodiments of apparatus 100 and 200 of FIGS. 1 and 2, respectively. Alternatively, decoding and encoding units may be included in peripheral devices 860 external to transceiver 820. Peripheral devices 860 may include any form computer-readable medium that has computer executable instructions to encode and decode data using two or more LDPC code constructions in accordance with various embodiments for decoding and encoding data. Peripheral devices 860 may also include displays, additional storage memory, or other control devices that may operate in conjunction with controller 810. Alternatively, peripheral devices 860 may include displays, additional storage memory, or other control devices that may operate in conjunction with controller 810, communication unit 840, and/or electronic device 820.

Embodiments for a system that includes an encoding unit and a decoding unit having two or more LPDC code constructions may be used in any system operating with a communication channel. The communication channel may be part of a land based communication network or a wireless communication network. Indeed, embodiments may well be implemented as part of any wireless system using multi-carrier wireless communication channels (e.g., orthogonal frequency-division multiplexing (OFDM), discrete multi-tone modulation (DMT), etc.), such as may be used within, without limitation, a wireless personal area network (WPAN), a wireless local area network (WLAN), a wireless metropolitan area network (WMAN), a wireless wide area network (WWAN), a cellular network, a third generation (3G) network, a fourth generation (4G) network, a universal mobile telephone system (UMTS), and similar communication systems.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. A method comprising:
partitioning a data block into a plurality of sub-blocks;
encoding a first sub-block using a first low density parity-check code construction such that a first codeword is formed;
encoding a second sub-block using a second low density parity-check code construction such that a second codeword is formed;
mapping the first codeword, the second codeword, and bits of an uncoded sub-block forming a signal to transmit into a communication channel using a transmitter, the mapping conducted such that each bit of the uncoded codeword selects a symbol of an alphabet from the mapping of the first codeword and the second codeword to provide the signal as a block of alphabet symbols, wherein the first low density parity-check code construction differs from the second low density parity-check code construction.

2. The method of claim 1, wherein using a first low density parity-check code construction includes selecting the first low density parity-check code construction with respect to bit-error degradation for low signal-to-noise ratios and using a second low density parity-check code construction includes selecting the second low density parity-check code construction with respect to avoiding an error floor.

3. The method of claim 1, wherein using a first low density parity-check code construction includes using a Progressive Edge Growth code construction.

4. The method of claim 1, wherein using a second low density parity-check code construction includes using a Reed Solomon low density parity-check code construction.

5. The method of claim 1, wherein the method further includes:
partitioning a PAM constellation into two 4-level cosets with a Progressive Edge Growth code construction to select one of the two 4-level cosets, the Progressive Edge Growth code construction being the first low density parity-check code construction; and
partitioning each 4-level coset into two 2-level co-cosets with a Reed Solomon low density parity-check code construction used to select one of the two 2-level co-cosets, the Reed Solomon low density parity-check code construction being the second low density parity-check code construction.

6. The method of claim 1, wherein the method is a multi-level coding process using the first and second low density parity-check code constructions.

7. A method comprising:
decoding a signal using a first low density parity-check code construction providing a first codeword, the signal received from a communication channel using a receiver;
decoding the signal using a second low density parity-check code construction and the first codeword providing a second codeword, wherein the first low density parity-check code construction differs from the second low density parity-check code construction;
extracting bits from the signal to provide a third codeword, the extracted bits corresponding to uncoded bits used to provide code modulation at a transmitting end, the bits extracted using encoding information obtained from decoding the signal using the first low density parity-check code construction and from decoding the signal using the second low density parity-check code construction and the first codeword, and
providing a completed message from a sum of message bits in each of the first codeword, the second codeword, and the third codeword.

8. The method of claim 7, wherein using a first low density parity-check code construction includes using a Progressive Edge Growth code construction, and using a second low density parity-check code construction includes using a Reed Solomon low density parity-check code construction.

9. The method of claim 7, wherein the method is a multi-stage decoding process using the first and second low density parity-check code constructions.

10. A computer readable device that stores instructions, which when performed by a machine, cause the machine to:
partition a data block into a plurality sub-blocks;
encode a first sub-block using a first low density parity-check code construction to form a first codeword;
encode a second sub-block using a second low density parity-check code construction to form a second codeword;
map the first codeword, the second codeword, and bits of an uncoded sub-block to form a signal such that each bit of the uncoded codeword selects a symbol of an alphabet from the mapping of the first codeword and the second codeword to provide the signal as a block of alphabet symbols, wherein the first low density parity-check code construction differs from the a second low density parity-check code construction.

11. The computer-readable device of claim 10, wherein the first low density parity-check code construction includes a Progressive Edge Growth code construction and the second low density parity-check code construction includes a Reed Solomon low density parity-check code construction.

12. The computer-readable medium device of claim 10, wherein to partition a data block includes:
partitioning a PAM constellation into two 4-level cosets with a Progressive Edge Growth code construction to select one of the two 4-level cosets, the Progressive Edge Growth code construction being the first low density parity-check code construction; and
partitioning each 4-level coset into two 2-level co-cosets with a Reed Solomon low density parity-check code construction used to select one of the two 2-level co-cosets, the Reed Solomon low density parity-check code construction being the first low density parity-check code construction.

13. A computer-readable device that stores instructions, which when performed by a machine, cause the machine to:
decode the signal using a first low density parity-check code construction to provide a first codeword;
decode the signal using a second low density parity-check code construction and the first codeword to provide a second codeword, wherein the first low density parity-check code construction differs from the a second low density parity-check code construction;
extract bits from the signal to provide a third codeword, the extracted bits corresponding to uncoded bits used to provide code modulation at a transmitting end, the bits extracted using encoding information obtained from decoding the signal using the first low density parity-check code construction and from decoding the signal using the second low density parity-check code construction and the first codeword, and
provide a completed message from a sum of message bits in each of the first codeword, the second codeword, and the third codeword.

14. The computer-readable device of claim 13, wherein the first low density parity-check code construction includes a Progressive Edge Growth code construction.

15. The computer-readable device of claim 13, wherein the second low density parity-check code construction includes a Reed Solomon low density parity-check code construction.

16. An apparatus comprising:
an encoder to encode data partitioned into a plurality of sub-blocks, the encoder having a first low density parity-check code construction to encode a first sub-block to form a first codeword and having a second low density parity-check code construction to encode a second sub-block to form a second codeword, wherein the first low density parity-check code construction differs from the second low density parity-check code construction; and
a mapper to map the first codeword, the second codeword, and bits of an uncoded sub-block to form a signal such that each bit of the uncoded codeword selects a symbol of an alphabet from the mapping of the first codeword and the second codeword to provide the signal as a block of alphabet symbols.

17. The apparatus of claim 16, wherein the first low density parity-check code construction includes a Progressive Edge Growth code construction and the second low density parity-check code construction includes a Reed Solomon low density parity-check code construction.

18. The apparatus of claim 16, wherein the encoder is adapted to partition a PAM constellation into two 4-level cosets with a Progressive Edge Growth code construction to select one of the two 4-level cosets, and partition each 4-level coset into two 2-level co-cosets with a Reed Solomon low density parity-check code construction to select one of the two 2-level co-cosets, the Progressive Edge Growth code construction being the first low density parity-check code construction and the Reed Solomon low density parity-check code construction being the second low density parity-check code construction.

19. An apparatus comprising:
a decoder to decode a signal from a communication channel to provide decoded data, the decoder having a first low density parity-check code construction to provide a first codeword and a second low density parity-check code construction to provide a second codeword from the first codeword and the signal, wherein the first low density parity-check code construction differs from the a second low density parity-check code construction, the decoder configured to extract bits from the signal to provide a third codeword, the extracted bits corresponding to uncoded bits used to provide code modulation at a transmitting end, the bits operatively extracted using encoding information obtained from decoding the signal using the first low density parity-check code construction and from decoding the signal using the second low density parity-check code construction and the first codeword, the decoder arranged to provide a completed message from a sum of message bits in each of the first codeword, the second codeword, and the third codeword.

20. The apparatus of claim 19, wherein the first low density parity-check code construction includes a Progressive Edge Growth code construction.

21. The apparatus of claim 19, wherein the second low density parity-check code construction includes a Reed Solomon low density parity-check code construction.

22. A system comprising:
an encoder to encode data partitioned into a plurality of sub-blocks, the encoder having a first low density parity-check code construction to encode a first sub-block to form a first codeword and having a second low density parity-check code construction to encode a second sub-block to form a second codeword, wherein the first low density parity-check code construction differs from the a second low density parity-check code construction;

a mapper to map the first codeword, the second codeword, and bits of an uncoded sub-block to form a signal such that each bit of the uncoded codeword selects a symbol of an alphabet from the mapping of the first codeword and the second codeword to provide the signal as a block of alphabet symbols;

a transmitter to transmit the signal; and a network interface having connections to couple the transmitter to a wired network.

23. The system of claim 22, wherein the first low density parity-check code construction includes a Progressive Edge Growth code construction and the second low density parity-check code construction includes a Reed Solomon low density parity-check code construction.

24. The system of claim 22, wherein the network interface includes a network interface card.

25. The system of claim 22, wherein the network interface is compliant with 10GBase-T.

26. The system of claim 22, wherein the system further includes at least one of a computer, a switch, a router, or a server.

27. The system of claim 26, wherein the system further includes connections to the at least one of a computer, a switch, a router, or a server that are compatible with PCI.

28. The system of claim 26, wherein the system further includes connections to the at least one of a computer, a switch, a router, or a server that are compatible with PCI express.

29. A system comprising:

a receiver to receive a signal from a communication channel;

a decoder to decode the signal to provide decoded data, the decoder having a a first low density parity-check code construction to provide a first codeword and a second low density parity-check code construction to provide a second codeword from the first codeword and the signal, wherein the first low density parity-check code construction differs from the a second low density parity-check code construction, the decoder configured to extract bits from the signal to provide a third codeword, the extracted bits corresponding to uncoded bits used to provide code modulation at a transmitting end, the bits operatively extracted using encoding information obtained from decoding the signal using the first low density parity-check code construction and from decoding the signal using the second low density parity-check code construction and the first codeword, the decoder arranged to provide a completed message from a sum of message bits in each of the first codeword, the second codeword, and the third codeword; and a network interface having connections to couple the receiver to a wired network.

30. The system of claim 29, wherein the first low density parity-check code construction includes a Progressive Edge Growth code construction and the second low density parity-check code construction includes a Reed Solomon low density parity-check code construction.

31. The system of claim 29, wherein the network interface includes a network interface card.

32. The system of claim 29, wherein the network interface is compliant with 10GBase-T.

33. The system of claim 29, wherein the system further includes at least one of a computer, a switch, a router, or a server.

34. The system of claim 33, wherein the system further includes a connection to the at least one of a computer, a switch, a router, or a server that is compatible with PCI.

35. The system of claim 33, wherein the system further includes a connection to the at least one of a computer, a switch, a router, or a server that is compatible with PCI express.

* * * * *

UNITED STATES PATENT AND TRADEMARK OFFICE
CERTIFICATE OF CORRECTION

PATENT NO. : 8,051,355 B2  
APPLICATION NO. : 11/794446  
DATED : November 1, 2011  
INVENTOR(S) : Felix A. Taubin et al.

Page 1 of 1

It is certified that error appears in the above-identified patent and that said Letters Patent is hereby corrected as shown below:

In column 13, line 21, in Claim 10, delete "the a" and insert -- the --, therefor.

In column 13, line 28, in Claim 12, delete "medium device" and insert -- device --, therefor.

In column 13, line 49, in Claim 13, delete "the a" and insert -- the --, therefor.

In column 14, line 39, in Claim 19, delete "the a" and insert -- the --, therefor.

In column 14, line 66, in Claim 22, delete "the a" and insert -- the --, therefor.

In column 15, line 33, in Claim 29, delete "a a" and insert -- a --, therefor.

In column 16, line 2, in Claim 29, delete "the a" and insert -- the --, therefor.

Signed and Sealed this
Thirty-first Day of January, 2012

David J. Kappos
*Director of the United States Patent and Trademark Office*